US012770938B2

(12) United States Patent
He et al.

(10) Patent No.: US 12,770,938 B2
(45) Date of Patent: Oct. 20, 2026

(54) BATTERY TEST ASSEMBLY, BATTERY ASSEMBLY, CHARGING ASSEMBLY, AND ELECTRIC DEVICE

(71) Applicant: CONTEMPORARY AMPEREX TECHNOLOGY (HONG KONG) LIMITED, Hong Kong (CN)

(72) Inventors: Zehong He, Ningde (CN); Qiang Du, Ningde (CN); Caixia Huang, Ningde (CN); Zhongxing Xiao, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 314 days.

(21) Appl. No.: 18/622,521

(22) Filed: Mar. 29, 2024

(65) Prior Publication Data

US 2024/0243372 A1 Jul. 18, 2024

Related U.S. Application Data

(63) Continuation of application No. PCT/CN2022/142805, filed on Dec. 28, 2022.

(30) Foreign Application Priority Data

Jan. 7, 2022 (CN) ......................... 202220039173.4

(51) Int. Cl.
*H01M 10/42* (2006.01)
*G01R 1/073* (2006.01)
(Continued)

(52) U.S. Cl.
CPC ........ *H01M 10/4285* (2013.01); *G01R 1/073* (2013.01); *G01R 31/3835* (2019.01); *H01M 10/44* (2013.01); *H02J 7/96* (2026.01)

(58) Field of Classification Search
CPC .. H01M 10/4285; H01M 10/44; H01M 10/42; G01R 1/073; G01R 31/3835;
(Continued)

(56) References Cited

U.S. PATENT DOCUMENTS

2007/0145947 A1* 6/2007 Sakurai .................. H02J 7/663 320/132
2014/0092512 A1* 4/2014 Fan ...................... G01R 31/382 361/91.1
(Continued)

FOREIGN PATENT DOCUMENTS

CN 1415972 A 5/2003
CN 201269921 Y 7/2009
(Continued)

OTHER PUBLICATIONS

English translation of CN-211955754-U (Year: 2020).*
(Continued)

*Primary Examiner* — Huy Q Phan
*Assistant Examiner* — Haidong Zhang
(74) *Attorney, Agent, or Firm* — ANOVA LAW GROUP, PLLC

(57) ABSTRACT

A battery test assembly includes: a positive electrode probe having a first end configured to be electrically connected to a positive electrode of the battery having a first end configured to be electrically connected to a negative electrode of the battery electrically connected to each of a second end of the positive electrode probe and a second end of the negative electrode probe is configured to test a voltage between the positive electrode and the negative electrode of the battery by testing a voltage between the second end of the positive electrode probe and the second end of the negative electrode probe.

10 Claims, 8 Drawing Sheets

60

(51) Int. Cl.

| | |
|---|---|
| ***G01R 31/3835*** | (2019.01) |
| ***H01M 10/44*** | (2006.01) |
| ***H02J 7/00*** | (2026.01) |
| ***H02J 7/96*** | (2026.01) |

(58) Field of Classification Search

CPC ..... G01R 31/3644; G01R 31/385; H02J 7/96; H02J 7/751; H02J 7/80; Y02E 60/10

See application file for complete search history.

(56) References Cited

U.S. PATENT DOCUMENTS

| | | | | |
|---|---|---|---|---|
| 2015/0340883 A1* | 11/2015 | Kanai | ................. | H01M 10/482 320/118 |
| 2016/0084917 A1* | 3/2016 | Nam | .................... | G01R 31/392 324/432 |

FOREIGN PATENT DOCUMENTS

| | | | | | |
|---|---|---|---|---|---|
| CN | 201397381 | Y | | 2/2010 | |
| CN | 102544590 | A | | 7/2012 | |
| CN | 202710619 | U | | 1/2013 | |
| CN | 107332512 | A | | 11/2017 | |
| CN | 109752661 | A | | 5/2019 | |
| CN | 211955754 | U | * | 11/2020 | |
| CN | 217181168 | U | | 8/2022 | |
| JP | S5975729 | U | * | 5/1984 | |
| JP | S5999271 | A | | 6/1984 | |
| JP | H06124731 | A | * | 5/1994 | ................ H02J 7/00 |
| JP | 2015117995 | A | | 6/2015 | |
| JP | 2020532061 | A | | 11/2020 | |
| KR | 101389023 | B1 | | 4/2014 | |
| KR | 101642341 | B1 | | 7/2016 | |
| WO | 2011102524 | A1 | | 8/2011 | |
| WO | 2013035149 | A1 | | 3/2013 | |

OTHER PUBLICATIONS

English translation of JP-H06124731-A (Year: 1994).*

English translation of JP-S5975729-U (Year: 1984).*

The World Intellectual Property Organization (WIPO) International Search Report for PCT/CN2022/142805 Feb. 22, 2023 6 Pages (including translation).

The European Patent Office (EPO) The Extended European Search Report for Application No. 22918466.8, Feb. 28, 2025 9 Pages.

* cited by examiner

BATTERY TEST ASSEMBLY, BATTERY ASSEMBLY, CHARGING ASSEMBLY, AND ELECTRIC DEVICE

CROSS-REFERENCE TO RELATED APPLICATIONS

This application is a continuation of International Application No. PCT/CN2022/142805, filed on Dec. 28, 2022, which claims priority to Chinese Patent Application No. 202220039173.4, titled "BATTERY TEST ASSEMBLY, BATTERY ASSEMBLY, CHARGING ASSEMBLY, AND ELECTRIC DEVICE" and filed on Jan. 7, 2022, the entire contents of both of which are incorporated herein by reference.

FIELD

The present disclosure relates to the field of batteries, and more particularly, to a battery test assembly, a battery assembly, a charging assembly, and an electric device.

BACKGROUND

During the use of a battery, safe use of the battery is ensured by testing a voltage between a positive electrode of the battery and a negative electrode of the battery as a battery voltage and protecting the battery based on the tested voltage. If a test process of the battery is unstable, stability and accuracy of the tested voltage will be affected, which in turn affects the safe use of the battery.

SUMMARY

In view of the above problems, the present disclosure provides a battery test assembly, a battery assembly, a charging assembly, and an electric device, capable of avoiding a problem of safe use of a battery being affected due to an unstable test process of the battery.

In a first aspect, a battery test assembly is provided by the present disclosure. The battery test assembly includes a positive electrode probe, a negative electrode probe, and a tester. The positive electrode probe has a first end configured to be electrically connected to a positive electrode of a battery. The negative electrode probe has a first end configured to be electrically connected to a negative electrode of the battery. The tester is electrically connected to each of a second end of the positive electrode probe and a second end of the negative electrode probe. The tester is configured to test a voltage between the positive electrode of the battery and the negative electrode of the battery by testing a voltage between the second end of the positive electrode probe and the second end of the negative electrode probe.

In technical solutions according to embodiments of the present disclosure, with such a battery test assembly, the tester tests the voltage between the positive electrode of the battery and the negative electrode of the battery by testing the voltage between the second end of the positive electrode probe and the second end of the negative electrode probe, rather than by testing a voltage between the first end of the positive electrode probe and the first end of the negative electrode probe that are electrically connected to the positive electrode of the battery and the negative electrode of the battery, respectively, which avoids a problem of inaccuracy or instability of the tested voltage caused by inaccuracy or instability of the voltage between the first end of the positive electrode probe and the first end of the negative electrode probe due to contamination of an electrolyte or crystallization of electrolyte vapors. Therefore, the safe use of the battery can be prevented from being affected by inaccuracy or instability of a voltage tested in the test process of the battery. Also, the voltage between the second end of the positive electrode probe and the second end of the negative electrode probe is tested by the tester as the voltage between the positive electrode of the battery and the negative electrode of the battery. During charging of the battery, since the tested voltage between the second end of the positive electrode probe and the second end of the negative electrode probe is greater than an actual voltage between the positive electrode of the battery and the negative electrode of the battery, determining, based on the tested voltage between the second end of the positive electrode probe and the second end of the negative electrode probe, whether the voltage of the battery reaches a cut-off voltage during the charging effectively reduces a risk of overcharging the battery. Similarly, during discharging, since the tested voltage between the second end of the positive electrode probe and the second end of the negative electrode probe is smaller than the actual voltage between the positive electrode of the battery and the negative electrode of the battery, determining, based on the tested voltage between the second end of the positive electrode probe and the second end of the negative electrode probe, whether the voltage of the battery reaches the cut-off voltage during the discharging effectively reduces a risk of overdischarging the battery, which further improves use safety of the battery during the charging and the discharging.

In some embodiments, the first end of the positive electrode probe has a size greater than a size of the second end of the positive electrode probe, and the first end of the negative electrode probe has a size greater than a size of the second end of the negative electrode probe. By setting each of the positive electrode probe and the negative electrode probe to have a greater size at the first end than at the second end, a contact area between the positive electrode probe and the positive electrode of the battery and a contact area between the negative electrode probe and the negative electrode of the battery are large, which reduces and stabilizes a contact resistance between each of the positive electrode probe and the negative electrode probe and the battery. Therefore, excessive voltage consumption on the contact resistance in the test process is avoided. In addition, stability of the test process is improved.

In some embodiments, at least one of the positive electrode probe and the negative electrode probe has a cylindrical protrusion structure. By setting each of the positive electrode probe and the negative electrode probe into the cylindrical protrusion structure, the battery test assembly has a simple structure and is easy to produce and manufacture.

In some embodiments, each of the second end of the positive electrode probe and the second end of the negative electrode probe includes a first connection portion and a second connection portion, the first connection portion being configured to be electrically connected to an external circuit, and the second connection portion being configured to be electrically connected to the tester. With the above-mentioned design, a current transmission probe which realizes a function of connecting to the external circuit to transmit a current at the positive electrode of the battery, and a voltage sampling probe which realizes a function of electrically connecting to the tester to test the voltage between the positive electrode of the battery and the negative electrode of the battery at the positive electrode of the battery, can be realized by a same positive electrode probe during use of the battery. Similarly, a current transmission probe and a voltage sampling probe at the negative electrode of the battery are realized by a same negative electrode probe. Therefore, a quantity of probes to be set up during the use of the battery is reduced, which simplifies a probe design.

In some embodiments, the first end of the positive electrode probe has a fixation structure configured to fixedly connect the first end of the positive electrode probe to the positive electrode, and the first end of the negative electrode probe has a fixation structure configured to fixedly connect the first end of the negative electrode probe to the negative electrode. With the above-mentioned design, the positive electrode probe and the negative electrode probe can be fixed at the positive electrode of the battery and the negative electrode of the battery, respectively, which simplifies a design of the battery.

In a second aspect, the present disclosure provides a battery assembly. The battery assembly includes the battery test assembly according to the above-mentioned embodiments and a battery. The battery test assembly is configured to test a voltage of the battery.

In the technical solutions of the embodiments of the present disclosure, since the battery test assembly included in the battery assembly avoids the problem of the safe use of the battery being affected due to the unstable test process of the battery, the safety of the battery during use is improved.

In a third aspect, the present disclosure provides a charging assembly. The charging assembly includes the battery test assembly according to the above-mentioned embodiments, a charging power supply, and a power management unit. The battery test assembly is configured to test a voltage between a positive electrode of a to-be-charged battery and a negative electrode of the to-be-charged battery. The charging power supply is configured to charge the to-be-charged battery. The power management unit is communicatively connected with the charging power supply and the tester, and is configured to control, based on the voltage tested by the battery test assembly, the charging power supply to charge the to-be-charged battery.

In the technical solutions according to the embodiments of the present disclosure, the battery test assembly in the charging assembly tests the voltage between the positive electrode of the to-be-charged battery and the negative electrode of the to-be-charged battery by testing the voltage between the second end of the positive electrode probe and the second end of the negative electrode probe, which avoids a problem of inaccuracy or instability of the tested voltage between the positive electrode of the to-be-charged battery and the negative electrode of the to-be-charged battery due to the contamination of the electrolyte or the crystallization of the electrolyte vapors. Therefore, safety of the to-be-charged battery when charged by the charging assembly is improved. In addition, during the charging of the battery, the power management unit controls, based on the voltage tested by the battery test assembly, the charging power supply to charge the to-be-charged battery, and controls, in response to the tested voltage reaching the cut-off voltage, the charging power supply to stop charging a to-be-charged power supply. The battery test assembly tests the voltage between the second end of the positive electrode probe and the second end of the negative electrode probe as the tested voltage between the positive electrode of the to-be-charged battery and the negative electrode of the to-be-charged battery. Since the tested voltage is greater than an actual voltage of the to-be-charged battery, overcharging of the to-be-charged battery by the charging power supply is effectively avoided.

In some embodiments, the power management unit includes a timer electrically connected to the charging power supply. The timer is configured to collect a charging time length for the charging power supply to charge the to-be-charged battery. The power management unit is further configured to control, based on the charging time length collected by the timer, the charging power supply to charge the to-be-charged battery. A time length for the charging power supply to charge the to-be-charged power supply is controlled by the power management unit based on a time length collected by the timer. The charging power supply is controlled, by the power management unit in response to the time length recorded by the timer reaching a cut-off time length, to stop charging the to-be-charged power supply. In this way, the charging time length is kept consistent in a case of a consistent charging current magnitude to ensure consistency of a capacity of the to-be-charged battery after being charged, which avoids the overcharging of the to-be-charged battery and improves consistency of the charging of the to-be-charged battery.

In some embodiments, the power management unit includes a voltage correction unit configured to correct the voltage tested by the battery test assembly. The power management unit is further configured to control the charging power supply based on the voltage corrected by the voltage correction unit. The voltage tested by the battery test assembly is corrected by the voltage correction unit, in such a manner that the corrected voltage takes into account a contact resistance between the positive electrode of the to-be-charged battery and the positive electrode probe of the battery test assembly and a contact resistance between the negative electrode of the to-be-charged battery and the negative electrode probe of the battery test assembly. Therefore, the corrected voltage can more accurately reflect the voltage between the second end of the positive electrode probe and the second end of the negative electrode probe of the battery test assembly. The charging power supply is controlled by the power management unit based on the corrected voltage, which further ensures safety of the charging of the to-be-charged battery.

In some embodiments, the charging power supply includes a plurality of charging sub-power-supplies. A plurality of charging currents corresponding to respective ones of the plurality of charging sub-power-supplies is not all identical, such that the charging power supply is capable of charging the to-be-charged battery using one of the plurality of charging currents. The voltage correction unit is configured to correct, based on the charging current used by the charging power supply, the voltage tested by the battery test assembly. The voltage tested by the battery test assembly is corrected by the voltage correction unit based on the charging current used by the charging power supply, which ensures the safety of the charging of the to-be-charged battery under different charging rates.

In a fourth aspect, the present disclosure provides an electric device. The electric device includes the battery assembly according to the above-mentioned embodiments and a load component. The load component is connected to the positive electrode of the battery and the negative electrode of the battery to discharge the battery.

In the technical solutions according to the embodiments of the present disclosure, since the battery test assembly included in the battery assembly avoids the problem of the safe use of the battery being affected due to the unstable test process of the battery, the safety of the battery during use is improved, and thus safety of the electric device in use is also improved.

In some embodiments, the electric device further includes a power management unit. The power management unit is configured to control, based on the voltage tested by the tester, the battery to supply power to the load component, and disconnect the load component from the positive electrode of the battery in the battery assembly and the negative electrode of the battery in the battery assembly in response to the voltage tested by the tester reaching a cut-off voltage. During use of the electric device, the battery is discharged, and the power management unit controls, based on the voltage tested by the tester of the battery assembly, the battery to supply power to the load component, and disconnects the load component from the positive electrode of the battery and the negative electrode of the battery in response to the tested voltage reaching the cut-off voltage. The tester tests the voltage between the second end of the positive electrode probe and the second end of the negative electrode probe as the tested voltage between the positive electrode of the battery and the negative electrode of the battery. Since the voltage between the second end of the positive electrode probe and the second end of the negative electrode probe is smaller than the voltage between the positive electrode of the battery and the negative electrode of the battery, over-discharging of the battery is effectively avoided.

In some embodiments, the power management unit includes a voltage correction unit configured to correct the voltage tested by the battery test assembly. The power management unit is further configured to control the battery based on the voltage corrected by the voltage correction unit. The voltage tested by the battery test assembly is corrected by the voltage correction unit, in such a manner that the corrected voltage takes into account a contact resistance between the positive electrode of the battery and the positive electrode probe of the battery test assembly and a contact resistance between the negative electrode of the battery and the negative electrode probe of the battery test assembly. Therefore, the corrected voltage can more accurately reflect the voltage between the second end of the positive electrode probe and the second end of the negative electrode probe of the battery test assembly. The battery is controlled by the power management unit based on the corrected voltage, which further improves the safety of the battery during discharging.

In some embodiments, the load component includes a plurality of load sub-components. A plurality of discharge currents corresponding to respective ones of the plurality of load sub-components is not all identical. The battery is configured to output one of the plurality of discharge currents when discharged. The voltage correction unit is configured to correct, based on the discharge current outputted by the battery, the voltage tested by the battery test assembly. The voltage tested by the battery test assembly is corrected by the voltage correction unit based on the discharge current outputted by the battery when the battery is discharged, which ensures safety of the discharging of the battery under different discharging rates.

The above description is merely an overview of the technical solutions of the present disclosure. To facilitate a clear understanding of technical means of the present disclosure and the implementations of the technical solutions in accordance with the contents of the specification, and to clarify and explain the above and other objects, features, and advantages of the present disclosure, specific embodiments of the present disclosure will be described below.

BRIEF DESCRIPTION OF THE DRAWINGS

In order to clearly explain technical solutions of the embodiments of the present disclosure or in the related art, drawings used in the description of the embodiments or the related art are briefly described below. Obviously, the drawings as described below are merely some embodiments of the present disclosure. Based on these drawings, other drawings can be obtained by those skilled in the art without inventive effort. Other advantages and benefits will become apparent to those skilled in the art after reading the detailed description of embodiments given below. The accompanying drawings are used for a purpose of illustrating the embodiments only, rather than limiting the present disclosure. In addition, same elements are denoted by same reference numerals throughout the accompanying drawings.

DETAILED DESCRIPTION

Figure 1:
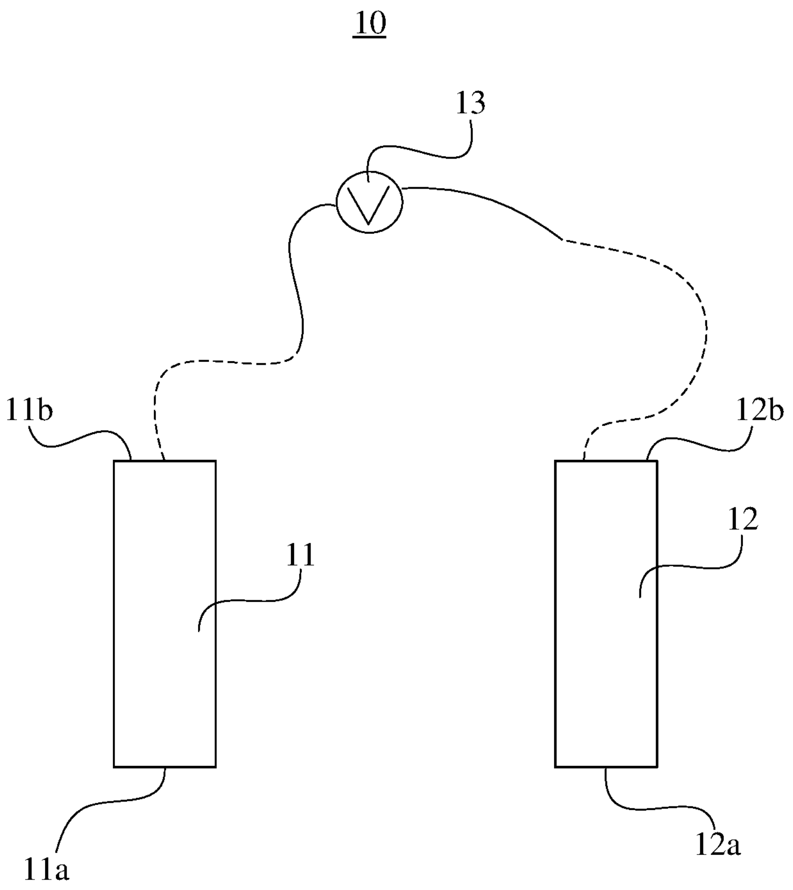
FIG. 1 is a schematic diagram of a battery test assembly according to some embodiments of the present disclosure.

Embodiments of technical solutions of the present disclosure will be described in detail below with reference to the accompanying drawings. The following embodiments are only used to explain the technical solutions of the present disclosure more clearly, and therefore should be construed as examples only, rather than limitations of the protection scope of the present disclosure.

Unless otherwise defined, all technical and scientific terms used herein have the same meaning as commonly understood by those skilled in the art of the present disclosure. Terms in the present disclosure herein are only used for the purpose of describing specific embodiments, and are not intended to limit the present disclosure. Terms "including", "having", and any variations thereof in the specification, claims, and accompanying drawings of the present disclosure are intended to cover non-exclusive inclusions.

In the description of the embodiments of the present disclosure, the technical terms "first", "second", etc. are used to distinguish different objects, and cannot be understood as indicating or implying relative importance or implicitly specifying a number, a particular order, or a primary or secondary relationship of the indicated technical features. In the description of the embodiments of the present disclosure, "plurality" means at least two, unless otherwise specifically defined.

In the present disclosure, "embodiment" means that a particular feature, structure, or characteristic described in conjunction with the embodiment or implementation may be included in at least one embodiment of the present disclosure. The presence of the term at each place in the specification does not necessarily refer to the same embodiment, nor does it refer to an independent or alternative embodiment that is mutually exclusive of other embodiments. It should be understood by those skilled in the art, both explicitly and implicitly, that the embodiments described herein may be combined with other embodiments.

In the description of the embodiments of the present disclosure, the term "and/or" only represents a relationship between correlated objects, including three relationships. For example, "A and/or B" may mean three situations: A only, B only, or both A and B. In addition, the character "/" in the present disclosure generally represents an "or" relationship between the correlated objects preceding and succeeding the symbol. In this disclosure, the phrases "at least one of A, B, and C" and "at least one of A, B, or C" both mean only A, only B, only C, or any combination of A, B, and C.

In the description of the embodiments of the present disclosure, the term "plurality" refers to more than two (including two). Similarly, "plurality of groups" refers to more than two groups (including two groups), and "plurality of pieces" refers to more than two pieces (including two pieces).

In the description of the embodiments of the present disclosure, the orientation or the position indicated by technical terms such as "center", "longitudinal", "lateral", "length", "width", "thickness", "over", "below", "front", "rear", "left", "right", "vertical", "horizontal", "top", "bottom", "inner", "outer", "clockwise", "anti-clockwise", "axial", "radial", and "circumferential" should be construed to refer to the orientation and the position as shown in the drawings, and is only for the convenience of describing the embodiments of the present disclosure and simplifying the description, rather than indicating or implying that the pointed device or element must have a specific orientation, or be constructed and operated in a specific orientation, and therefore cannot be understood as a limitation of the embodiments of the present disclosure.

In the description of the embodiments of the present disclosure, unless otherwise clearly specified and limited, technical terms such as "install", "connect", "connect to", "fix" and the like should be understood in a broad sense. For example, it may be a fixed connection or a detachable connection or connection as one piece; mechanical connection or electrical connection; direct connection or indirect connection through an intermediate; internal communication of two components or the interaction relationship between two components. For those skilled in the art, the specific meaning of the above-mentioned terms in the embodiments of the present disclosure can be understood according to specific circumstances.

In some cases, a voltage of a battery is tested through a four-probe method. Specifically, a four-point probe is formed by a positive electrode current transmission probe and a positive electrode voltage sampling probe that are connected to a positive electrode of the battery, and a negative electrode current transmission probe and a negative electrode voltage sampling probe that are connected to a negative electrode of the battery. A voltage between the positive electrode of the battery and the negative electrode of the battery is tested by the four-point probe. To accurately reflect the voltage between the positive electrode of the battery and the negative electrode of the battery by the tested voltage, the positive electrode voltage sampling probe and the negative electrode voltage sampling probe each need to be provided in a structure having a very low resistance and are insulated from the positive electrode current transmission probe and the negative electrode current transmission probe, respectively, which reduces as much as possible voltages in tested voltages other than the voltage between the positive electrode of the battery and the negative electrode of the battery.

It was found that by the applicant, in a process of testing the voltage of the battery by the above-mentioned four-point probe, the four-point probe is electrically connected to the positive electrode of the battery and the negative electrode of the battery through the positive electrode voltage sampling probe and the negative electrode voltage sampling probe, respectively, and tests voltages between connection points to test the voltage between the positive electrode of the battery and the negative electrode of the battery. For this reason, the tested voltage is often influenced by the connection point between the positive electrode voltage sampling probe and the positive electrode and the connection point between the negative electrode voltage sampling probe and the negative electrode. When the connection points are contaminated, or when a high concentration of electrolyte vapors causes crystallization at the above-mentioned connection points, the tested voltage is often unstable or inaccurate, or even no voltage can be tested. Therefore, a process of protecting the battery based on the tested voltage is affected, which in turn affects safe use of the battery.

On this basis, a battery test assembly is inventively designed. The battery test assembly includes a positive electrode probe, a negative electrode probe, and a tester. The positive electrode probe has a first end electrically connected to a positive electrode of a battery. The negative electrode probe has a first end electrically connected to a negative electrode of the battery. Each of a second end of the positive electrode probe and a second end of the negative electrode probe is electrically connected to the tester. The tester is configured to test a voltage between the positive electrode of the battery and the negative electrode of the battery by testing a voltage between the second end of the positive electrode probe and the second end of the negative electrode probe.

In such a battery test assembly, the tester tests the voltage between the positive electrode of the battery and the negative electrode of the battery by testing the voltage between the second end of the positive electrode probe and the second end of the negative electrode probe, rather than by testing a voltage between the first end of the positive electrode probe and the first end of the negative electrode probe that are electrically connected to the positive electrode of the battery and the negative electrode of the battery, which avoids a problem of inaccuracy or instability of the tested voltage caused by inaccuracy or instability of the voltage between the first end of the positive electrode probe and the first end of the negative electrode probe due to contamination of an electrolyte or crystallization of electrolyte vapors. Therefore, the safe use of the battery can be prevented from being affected by instability of a test process of the battery.

In addition, the voltage between the second end of the positive electrode probe and the second end of the negative electrode probe is tested by the tester as the voltage between the positive electrode of the battery and the negative electrode of the battery. During charging of the battery, since the tested voltage between the second end of the positive electrode probe and the second end of the negative electrode probe is greater than an actual voltage between the positive electrode of the battery and the negative electrode of the battery, determining, based on the tested voltage between the second end of the positive electrode probe and the second end of the negative electrode probe, whether the voltage of the battery reaches a cut-off voltage during the charging effectively reduces a risk of overcharging the battery. Similarly, during discharging, since the tested voltage between the second end of the positive electrode probe and the second end of the negative electrode probe is smaller than the actual voltage between the positive electrode of the battery and the negative electrode of the battery, determining, based on the tested voltage between the second end of the positive electrode probe and the second end of the negative electrode probe, whether the voltage of the battery reaches the cut-off voltage during the discharging effectively reduces a risk of overdischarging the battery, which further improves use safety of the battery during the charging and the discharging.

The battery test assembly, a battery assembly, and the like disclosed in the embodiments of the present disclosure can be, but are not limited to being, applied in an electric device such as a vehicle, a ship, or an aircraft. The use of a power supply system having the electric device that is composed of the battery test assembly, the battery assembly, and the like disclosed in the present disclosure facilitates avoidance of a problem of the safe use of the battery being affected due to an unstable test process of the battery, which improves safety of the battery. Therefore, safety of the electric device is improved.

The embodiments of the present disclosure provide an electric device using a battery as a power supply. The electric device may be, but is not limited to, a cell phone, a tablet, a laptop computer, an electric toy, an electric tool, an electric scooter, an electric vehicle, a ship, a spacecraft, and the like. The electric toy may include a fixed electric toy or a mobile electric toy, e.g., a game console, an electric car toy, an electric ship toy, and an electric airplane toy. The spacecraft may include an airplane, a rocket, a space shuttle, a spaceship, or the like.

Figure 2:
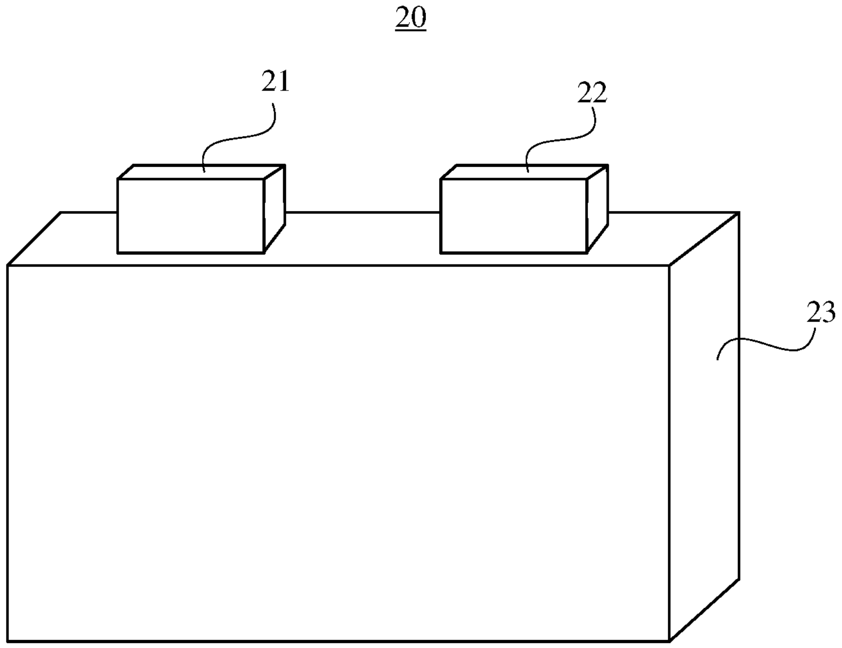
FIG. 2 is a schematic diagram of a structure of a battery according to some embodiments of the present disclosure.
Figure 3:
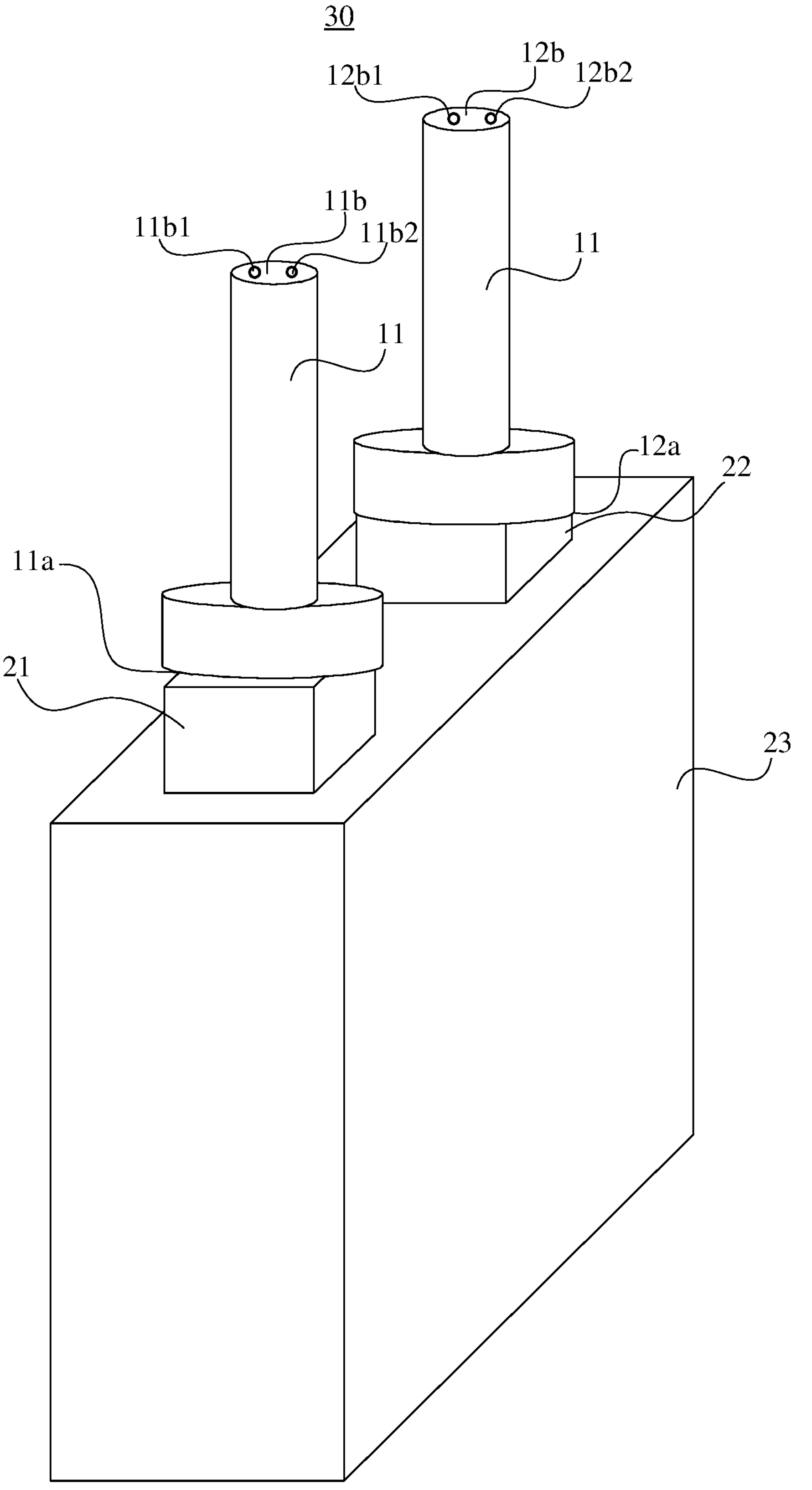
FIG. 3 is a schematic diagram of a structure of a battery assembly according to some embodiments of the present disclosure.
Figure 4:
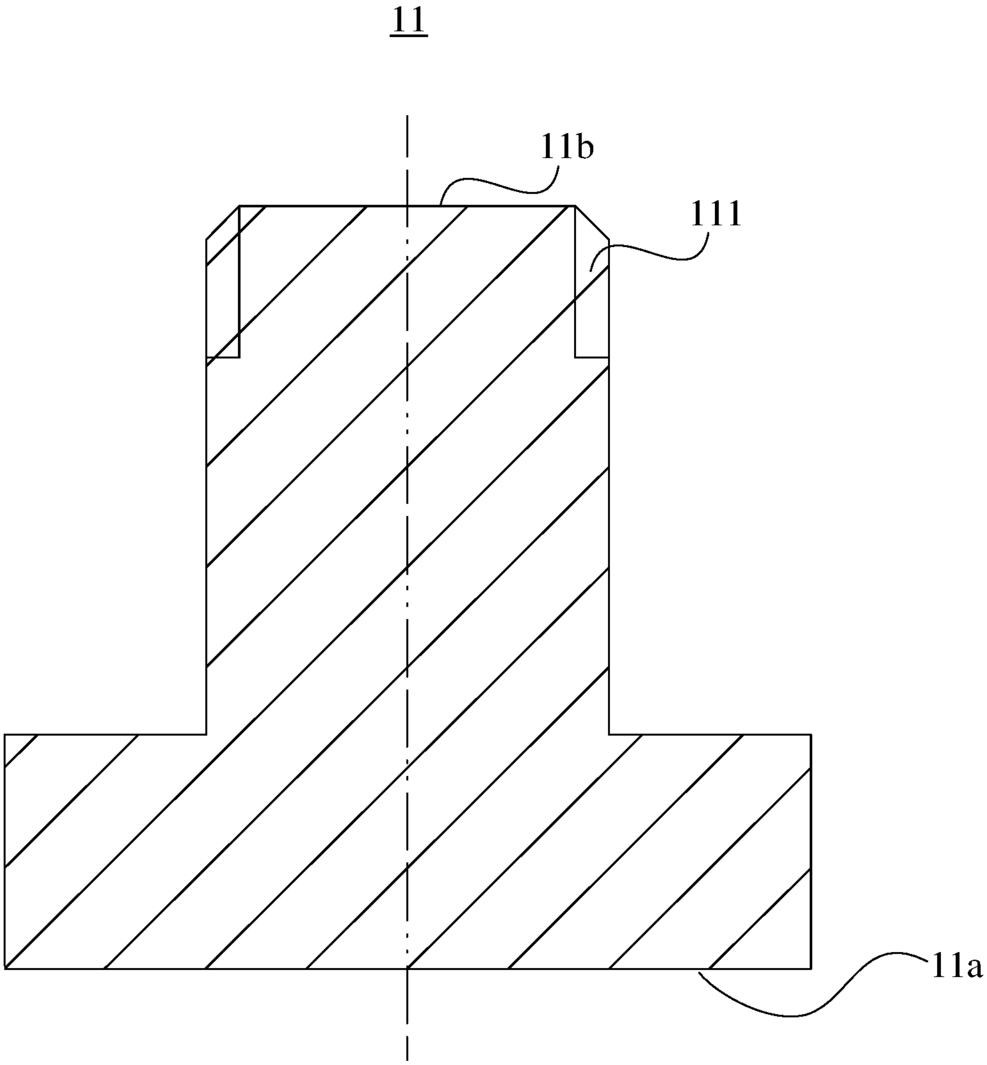
FIG. 4 is a schematic view of a structure of a positive electrode probe in a battery test assembly according to some embodiments of the present disclosure.
Figure 5:
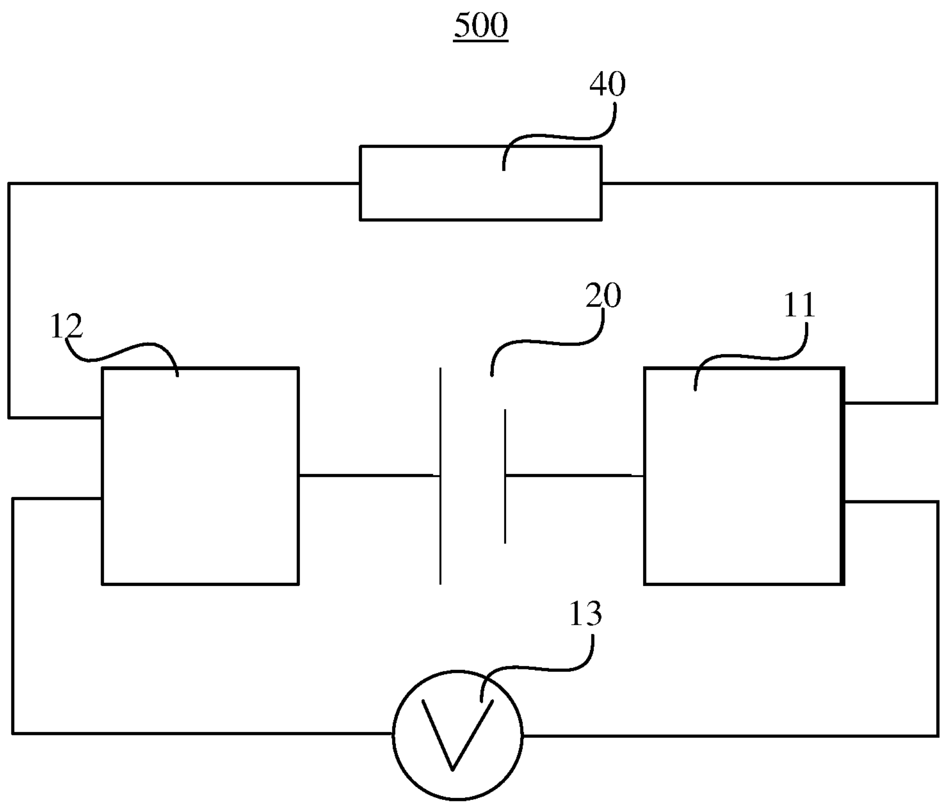
FIG. 5 is a diagram of a circuit for a battery test assembly to test a voltage between a positive electrode of a battery and a negative electrode of the battery according to some embodiments of the present disclosure.
Figure 6:
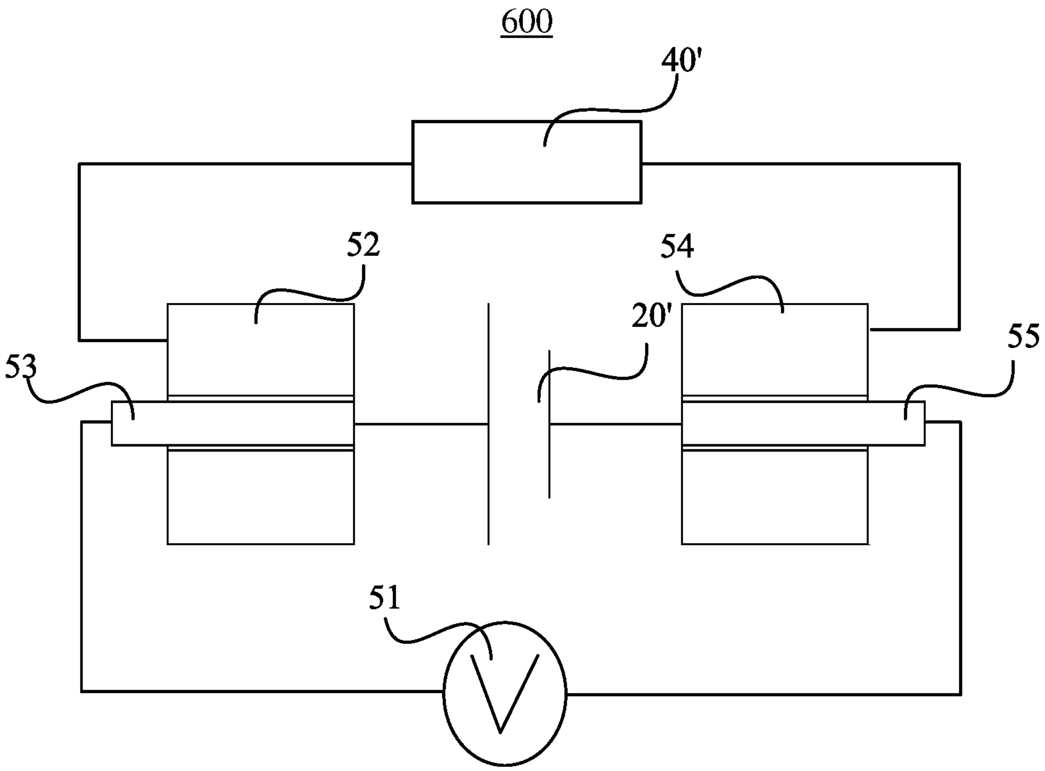
FIG. 6 is a diagram of a circuit for a four-point probe to test a voltage between a positive electrode of a battery and a negative electrode of the battery in the related art.

FIG. 1 is a schematic diagram of a battery test assembly according to some embodiments of the present disclosure. FIG. 2 is a schematic diagram of a structure of a battery according to some embodiments of the present disclosure. FIG. 3 is a schematic diagram of a structure of a battery assembly according to some embodiments of the present disclosure. The battery assembly includes the battery test assembly and the battery according to some embodiments of the present disclosure. FIG. 4 is a schematic view of a structure of a positive electrode probe in a battery test assembly according to some embodiments of the present disclosure. FIG. 5 is a diagram of a circuit for a battery test assembly to test a voltage between a positive electrode of a battery and a negative electrode of the battery according to some embodiments of the present disclosure. FIG. 6 is a diagram of a circuit for a four-point probe to test a voltage between a positive electrode of a battery and a negative electrode of the battery in the related art.

The present disclosure provides a battery test assembly 10. The battery test assembly 10 includes a positive electrode probe 11, a negative electrode probe 12, and a tester 13. The positive electrode probe 11 has a first end configured to be electrically connected to a positive electrode 21 of a battery 20. The negative electrode probe 22 has a first end configured to be electrically connected to a negative electrode 22 of the battery 20. Each of a second end 11*b* of the positive electrode probe 11 and a second end 12*b* of the negative electrode probe 12 is electrically connected to the tester 13. The tester 13 is configured to test a voltage between the positive electrode 21 of the battery 20 and the negative electrode 22 of the battery 20 by testing a voltage between the second end 11*b* of the positive electrode probe 11 and the second end 12*b* of the negative electrode probe 12.

The battery test assembly 10 is configured to test the voltage between the positive electrode 21 and the negative electrode 22 of the battery 20, to provide a basis for determining whether the battery 20 is in safe operation. The positive electrode probe 11 is a probe electrically connected to the positive electrode 21 of the battery 20, while the negative electrode probe 12 is a probe electrically connected to the negative electrode 22 of the battery 20. To minimize a voltage consumption on the probes during charging and discharging of the battery 20, and to prevent heat generated by the probes during the charging and the discharging of the battery 20 from affecting the battery, the positive electrode probe 11 and the negative electrode probe 12 each are made of an electrically conductive material having a resistance as low as possible. For example, the electrically conductive material may be, but is not limited to, gold, aluminum, etc.

The positive electrode probe 11 and the negative electrode probe 12 may have a same structure or different structures. In some embodiments, to simplify a manufacturing process, the positive electrode probe 11 and the negative electrode probe 12 have the same structure.

In some embodiments, the first end of the positive electrode probe 11 and the first end of the negative electrode probe 22 are fixed to the positive electrode 21 and the negative electrode 22 of the battery 20, respectively, to form a battery assembly with the battery 20. Referring to FIG. 3, a schematic diagram of a structure of a battery assembly 30 according to some embodiments is illustrated. As illustrated in FIG. 3, the first end of the positive electrode probe 11 and the first end of the negative electrode probe 12 are fixed to the positive electrode 21 and the negative electrode 22 of the battery 20, respectively. The positive electrode 21 and the negative electrode 22 of the battery 20 may each include a pole of the battery 20. In some examples, the positive electrode probe 11 and the negative electrode probe 12 are fixed to a pole of the positive electrode 21 and a pole of the negative electrode 22 of the battery 20, respectively, by means of pressing, to fix a first end 11*a* of the positive electrode probe 11 and a first end 12*a* of the negative electrode probe 12 to the positive electrode 21 and the negative electrode 22 of the battery 20, respectively. A gap between the first end 11*a* of the positive electrode probe 11 and the positive electrode and a gap between the first end 12*a* of the negative electrode probe 12 and the negative electrode are reduced by means of the pressing, simplifying the manufacturing process.

In other embodiments, the first end 11*a* of the positive electrode probe 11 and the first end 12*a* of the negative electrode probe 12 are detachably connected to the positive electrode 21 and the negative electrode 22 of the battery 20, respectively. In some embodiments, each of the first end 11*a* of the positive electrode probe 11 and the first end 12*a* of the negative electrode probe 12 is provided with a battery connection portion (not illustrated in the figures), to fixedly connect the positive electrode probe 11 and the negative electrode probe 12 to the positive electrode 21 and the negative electrode 22 of the battery 20, respectively, through the battery connection portions. In some embodiments, the battery connection portions may be a part of the positive electrode probe 11 and a part of the negative electrode probe 12. In other embodiments, the battery connection portions are a connection member attached to the positive electrode probe 11 and a connection member attached to the negative electrode probe 12. It should be understood that, when the battery connection portions are the connection member attached to the positive electrode probe 11 and the connection member attached to the negative electrode probe 12, each of the battery connection portions is made of an electrically conductive material.

In some embodiments, each of the second end 11*b* of the positive electrode probe 11 and the second end 12*b* of the negative electrode probe 12 is provided with a tester connection portion (not illustrated in the figures), to connect the positive electrode probe 11 and the negative electrode probe 12 to the tester through the tester connection portions. In some embodiments, the tester connection portions may be a part of the positive electrode probe 11 and a part of the negative electrode probe 12. In other embodiments, the tester connection portions are a connection member attached to the positive electrode probe 11 and a connection member attached to the negative electrode probe 12. It should be understood that, when the tester connection portions are the connection member attached to the positive electrode probe 11 and the connection member attached to the negative electrode probe 12, each of the tester connection portions is made of an electrically conductive material.

The tester 13 is a device for measuring a voltage. In some embodiments, the tester 13 includes a voltmeter and a voltage sampling line connected to the voltmeter. The voltage sampling line is used to connect the second end 11*b* of the positive electrode probe 11 and the second end 12*b* of the negative electrode probe 12.

In some embodiments, the second end 11*b* of the positive electrode probe 11 and the second end of the negative electrode probe 12 are detachably connected to the tester 13. In other embodiments, the second end 11*b* of the positive electrode probe 11 and the second end 12*b* of the negative electrode probe 12 are fixedly connected to the tester 13.

The voltage between the second end 11*b* of the positive electrode probe 11 and the second end 12*b* of the negative electrode probe 12 is tested by the tester 23 by means of electrically connecting the first end 11*a* of the positive electrode probe 11 and the first end 12*a* of the negative electrode probe 12 to the positive electrode 21 and the negative electrode 22 of the battery 20, respectively, and electrically connecting the tester 13 to the second end 11*b* of the positive electrode probe 11 and the second end of the negative electrode probe 12, realizing testing of the voltage between the positive electrode 21 and the negative electrode 22 of the battery 20.

During the test process of the battery, the tester 13 tests the voltage between the second end 11*b* of the positive electrode probe 11 and the second end 12*b* of the negative electrode probe 12, rather than tests a voltage between the first end 11*a* of the positive electrode probe 11 and the first end 12*a* of the negative electrode probe 12 that are electrically connected to the positive electrode 21 and the negative electrode 22 of the battery 20, which avoids inaccuracy or instability of the voltage between the first end 11*a* of the positive electrode probe 11 and the first end 12*a* of the negative electrode probe 12 due to contamination of an electrolyte or crystallization of electrolyte vapors, avoiding a problem of inaccuracy or instability of the tested voltage caused by instability of the voltage between the first end 11*a* of the positive electrode probe 11 and the first end 12*a* of the negative electrode probe 12. Therefore, the problem that the safe use of the battery is affected by instability of the test process of the battery is avoided.

In addition, the voltage between the second end 11*b* of the positive electrode probe 11 and the second end 12*b* of the negative electrode probe 12 is tested by the tester 13 as the voltage between the positive electrode 21 and the negative electrode 22 of the battery 20. During charging of the battery 20, since the tested voltage between the second end 11*b* of the positive electrode probe 11 and the second end 12*b* of the negative electrode probe 12 is greater than an actual voltage between the positive electrode 21 and the negative electrode 22 of the battery 20, determining, based on the tested voltage between the second end 11*b* of the positive electrode probe 11 and the second end 12*b* of the negative electrode probe 12, whether the voltage of the battery 20 reaches a cut-off voltage during the charging effectively reduces a risk of overcharging the battery 20. Similarly, during discharging, since the tested voltage between the second end 11*b* of the positive electrode probe 11 and the second end 12*b* of the negative electrode probe 12 is smaller than the actual voltage between the positive electrode 21 and the negative electrode 22 of the battery 20, determining, based on the tested voltage between the second end 11*b* of the positive electrode probe 11 and the second end 12*b* of the negative electrode probe 12, whether the voltage of the battery 20 reaches the cut-off voltage during the discharging effectively reduces a risk of overdischarging the battery 20, which further improves use safety of the battery 20 during the charging and the discharging.

According to some embodiments of the present disclosure, referring to FIG. 3, the first end 11*a* of the positive electrode probe 11 has a size greater than a size of the second end 11*b* of the positive electrode probe 11, and the first end 12*a* of the negative electrode probe 12 has a size greater than a size of the second end 12*b* of the negative electrode probe 12. In some embodiments, as illustrated in FIG. 4, the size of the first end 11*a* of the positive electrode probe 11 is greater than that of the second end 11*b* of the positive electrode probe 11.

The first end 11*a* of the positive electrode probe 11 is configured to be electrically connected to the positive electrode 11 of the battery 20, while the second end 11*b* of the positive electrode probe 11 is configured to be electrically connected to the tester 13. The first end 11*a* is set to have a greater size than that of the second end 11*b*, to realize a solid electrical connection between the positive electrode probe 11 and the positive electrode 21 of the battery 20, and to realize a large contact area between the first end 11*a* and the positive electrode 21 of the battery 20. Similarly, when the size of the first end 12*a* of the negative electrode probe 12 is greater than that of the second end 12*b* of the negative electrode probe 12, a stable electrical connection is realized between the negative electrode probe 12 and the negative electrode 22 of the battery 20, and a contact area is large.

By setting the size of the first end 11*a* of the positive electrode probe 11 to be greater than that of the second end 11*b* of the positive electrode probe 11, and by setting the size of the first end 12*a* of the negative electrode probe 12 to be greater than that of the second end 12*b*, a stable electrical connection and a large contact area are realized between the first end 11*a* of the positive electrode probe 11 and the positive electrode 21 and between the first end 12*a* of the negative electrode probe 12 and the negative electrode 22. Therefore, the battery 20 and each of the positive electrode probe 11 and the negative electrode probe 12 is as small as possible in a contact resistance and as stable as possible, in such a manner that voltages consumed on a contact resistance between the first end 11*a* of the positive electrode probe 11 and the positive electrode 21 and a contact resistance between the first end 12*a* of the negative electrode probe 12 and the negative electrode 22 in the test process are as small as possible. In addition, stability of the test process is improved.

According to some embodiments of the present disclosure, at least one of the positive electrode probe 11 and the negative electrode probe 12 has a cylindrical protrusion structure. In some embodiments, further referring to FIG. 3, both the positive electrode probe 11 and the negative electrode probe 12 have the cylindrical protrusion structure.

The positive electrode probe 11 has the cylindrical protrusion structure. That is, the positive electrode probe 11 includes two cylindrical parts with different diameters. In some embodiments, a first part with a smaller diameter is located on a second part with a greater diameter, which forms the cylindrical protrusion structure. In the embodiments of the present disclosure, the positive electrode probe 11 has the cylindrical protrusion structure, in such a manner that the first end 11*a* of the positive electrode probe 11 is a lower end of the cylindrical protrusion structure and the second end 11*b* of the positive electrode probe 11 is an upper end of the cylindrical protrusion structure. Since the lower end of the cylindrical protrusion structure has a size greater than a size of the upper end of the cylindrical protrusion structure, the size of the first end 11*a* of the positive electrode probe 11 is greater than that of the second end 11*b* of the positive electrode probe 11.

By setting each of the positive electrode probe 11 and the negative electrode probe 12 into the cylindrical protrusion structure, the battery test assembly 10 has a simple structure and is easy to produce and manufacture.

According to some embodiments of the present disclosure, further referring to FIG. 3, the second end 11*b* of the positive electrode probe 11 includes a first connection portion 11*b*1 and a second connection portion 11*b*2, and the second end 12*b* of the negative electrode probe 12 includes a third connection portion 12*b*1 and a fourth connection portion 12*b*2. The first connection portion 11*b*1 and the third connection portion 12*b*1 are configured to be electrically connected to an external circuit. The second connection portion 11*b*2 and the fourth connection portion 12*b*2 are configured to be electrically connected to the tester 13.

In some embodiments, referring to FIG. 4, the second end 11*b* of the positive electrode probe 11 is provided with the first connection portion 11*b*1 and the second connection portion 11*b*2 by using a connection structure 111. Similarly, the second end 12*b* of the negative electrode probe 12 may also be provided with the third connection portion 12*b*1 and the fourth connection portion 12*b*2 by using a same connection structure.

In some embodiments, the connection structure 111 has a threaded structure. Each of the first connection portion 11*b*1 and the second connection portion 11*b*2 is a part of the threaded structure. In some embodiments, the connection structure 111 has the threaded structure. The first connection portion 11*b*1 and the second connection portion 11*b*2 each have the threaded structure and are two contacts at an end face of the second end 11*b* of the positive electrode probe 11.

In some embodiments, the first connection portion 11*b*1 and the second connection portion 11*b*2 are provided at the second end 11*b* of the positive electrode probe 11 by means of attachment, and the third connection portion 12*b*1 and the fourth connection portion 12*b*2 are provided at the second end 12*b* of the negative electrode probe 12 by means of attachment. It should be understood that, when the first connection portion 11*b*1, the second connection portion 11*b*2, the third connection portion 12*b*1, and the fourth connection portion 12*b*2 are connection members attached to the positive electrode probe 11 and the negative electrode probe 12, each of the first connection portion 11*b*1, the second connection portion 11*b*2, the third connection portion 12*b*1, and the fourth connection portion 12*b*2 is made of an electrically conductive material.

In some embodiments, referring to FIG. 5, during testing, the positive electrode probe 11, the negative electrode probe 12, the battery 20, the tester 13, and the external circuit 40 form a circuit diagram 500. The first end 11*a* of the positive electrode probe 11 and the first end 12*a* of the negative electrode probe 12 are connected to the positive electrode 21 and the negative electrode 22 of the battery 20, respectively. The second end 11*b* of the positive electrode probe 11 and the second end 12*b* of the negative electrode probe 12 are connected to the tester 13 and the external circuit 14, respectively. With the first connection portion 11*b*1 and the second connection portion 11*b*2 that are at the second end 11*b* of the positive electrode probe 11, and the third connection portion 12*b*1 and the fourth connection portion 12*b*2 that are at the second end 12*b* of the negative electrode probe 12, the positive electrode probe 11 and the negative electrode probe 12 simultaneously assume a function of transmitting a current with the external circuit 40 and a function of connecting to the tester 13 to test the voltage between the positive electrode 21 and the negative electrode 22 of the battery 20, respectively.

The positive electrode probe 11 includes the first connection portion 11*b*1 configured to be electrically connected to the external circuit 40 and the second connection portion 11*b*2 configured to be electrically connected to the tester 13. The negative electrode probe 12 includes the third connection portion 12*b*1 configured to be electrically connected to the external circuit 40 and the fourth connection portion 12*b*2 configured to be electrically connected to the tester 13. In this way, the positive electrode probe 11 and the negative electrode probe 12 simultaneously assume a function of connecting to the external circuit 40 to transmit a current and a function of electrically connecting to the tester 13 to test the voltage between the positive electrode 21 and the negative electrode 22 of the battery 20, respectively. Therefore, a quantity of probes set up during use of the battery 20 is reduced, which simplifies a probe structure.

In a related design, when the voltage between the positive electrode of the battery and the negative electrode of the battery is tested using the four-probe method, the four-point probe composed of the positive electrode current transmission probe and the positive electrode voltage sampling probe that are connected to the positive electrode of the battery, and the negative electrode current transmission probe and the negative electrode voltage sampling probe that are connected to the negative electrode of the battery is used for testing. Referring to FIG. 6, in a test process in the related art, a circuit diagram 600 is formed with the four-point probe, a battery 20', a test device 51, and an external circuit 40'. The four-point probe includes a positive electrode current transmission probe 52 and a positive electrode voltage sampling probe 53 that are connected to a positive electrode of the battery 20', a negative electrode current transmission probe 54, and a negative electrode voltage sampling probe 55. The positive electrode current transmission probe 52 and the negative electrode current transmission probe 54 each are formed into a hollow structure, in such a manner that the positive electrode voltage sampling probe 53 and the negative electrode voltage sampling probe 55 extend through the hollow structure of the positive electrode current transmission probe 52 and the hollow structure of the negative electrode current transmission probe 54 to the positive electrode and a negative electrode of the battery 20', for testing a voltage between the positive electrode of the battery 20' and the negative electrode of the battery 20'. An insulation layer is provided between the positive electrode voltage sampling probe 53 and the positive electrode current transmission probe 52. An insulation layer is provided between the negative electrode current transmission probe 54 and the negative electrode voltage sampling probe 55.

In the above process of testing, using the four-point probe, the voltage between the positive electrode of the battery 20' and the negative electrode of the battery 20' through the four-probe method, a measurement is performed with four probes including the positive electrode current transmission probe 52, the positive electrode voltage sampling probe 53, the negative electrode current transmission probe 54, and the negative electrode voltage sampling probe 55.

A comparison between FIG. 5 and FIG. 6 reveals that, according to the embodiments of the present disclosure, the positive electrode current transmission probe 52 and the positive electrode voltage sampling probe 53 are combined into the positive electrode probe 11, and the negative electrode current transmission probe 54 and the negative electrode voltage sampling probe 55 are combined into the negative electrode probe 12. In a process of electrically connecting the positive electrode probe 11 and the negative electrode probe 12 to the external circuit 40 to transmit a current, a process of testing the voltage between the positive electrode of the battery 20' and the negative electrode of the battery 20' can be realized by electrically connecting the positive electrode probe 11 and the negative electrode probe 12 to the tester 13. Therefore, the positive electrode voltage sampling probe 53 and the negative electrode voltage sampling probe 55 can be omitted, which simplifies the probe structure and reduces the manufacturing process.

In addition, in the design of the present disclosure, the voltage between the second end 11*b* of the positive electrode probe 11 and the second end 12*b* of the negative electrode probe 12 is tested by the tester 13 as the voltage between the positive electrode 21 and the negative electrode 22 of the battery 20. During the charging of the battery, since the tested voltage between the second end 11*b* of the positive electrode probe 11 and the second end 12*b* of the negative electrode probe 12 is greater than the actual voltage between the positive electrode 21 and the negative electrode 22 of the battery 20, determining, based on the tested voltage between the second end 11*b* of the positive electrode probe 11 and the second end 12*b* of the negative electrode probe 12, whether the voltage of the battery 20 reaches the cut-off voltage during the charging effectively reduces the risk of overcharging the battery 20. Similarly, during the discharging, since the tested voltage between the second end 11*b* of the positive electrode probe 11 and the second end 12*b* of the negative electrode probe 12 is smaller than the actual voltage between the positive electrode of the battery and the negative electrode of the battery, determining, based on the tested voltage between the second end 11*b* of the positive electrode probe 11 and the second end 12*b* of the negative electrode probe 12, whether the voltage of the battery 20 reaches the cut-off voltage during the discharging effectively reduces the risk of overdischarging the battery 20, which further improves the use safety of the battery during the charging and the discharging.

According to some embodiments of the present disclosure, the first end 11*a* of the positive electrode probe 11 has a fixation structure configured to fixedly connect the first end 11*a* of the positive electrode probe 11 to the positive electrode, and the first end 12*a* of the negative electrode probe 12 has a fixation structure configured to fixedly connect the first end 12*a* of the negative electrode probe 12 to the negative electrode. In some embodiments, with the above-mentioned design, the positive electrode probe 11 and the negative electrode probe 12 can be fixed at the positive electrode 21 and the negative electrode 22 of the battery 20, respectively, which simplifies a design of the battery.

For example, the fixation structure may be a part of the positive electrode probe 11 and located at the first end of the positive electrode probe 11. In some embodiments, the fixation structure may be an end face of the first end 11*a* of the positive electrode probe 11 and is in contact with the pole of the positive electrode by means of pressing. In some embodiments, the fixation structure may be a threaded structure configured to bring, when connected to the positive electrode having a bolt structure engaged with the threaded structure by means of bolting, the first end 11*a* of the positive electrode probe 11 into contact with the pole of the positive electrode.

Each of the positive electrode probe 11 and the negative electrode probe 12 is fixed to the battery 20 by the fixation structure, in such a manner that the positive electrode probe 11, the negative electrode probe 12, and the battery form an entirety, which prevents contaminants introduced between the first end 11*a* of the positive electrode probe 11 and the positive electrode 21 of the battery 20 and between the first end 12*a* of the negative electrode probe 12 and the negative electrode 22 of the battery 20 from affecting the test process of the battery.

According to some embodiments of the present disclosure, the present disclosure further provides a battery assembly. The battery assembly includes the battery test assembly according to any of the above embodiments and a battery.

In some embodiments, referring to FIG. 3, the battery assembly 30 includes the battery test assembly 10 and the battery 20. The battery test assembly 10 includes the positive electrode probe 11 and the negative electrode probe 12 that are used for measuring the voltage of the battery 20. The battery 20 includes the positive electrode 21, the negative electrode 22, and a main body portion 23. The positive electrode 21 is electrically connected to the first end 11*a* of the positive electrode probe 11 in the battery test assembly 10. The negative electrode 22 is electrically connected to the first end 12*a* of the negative electrode probe 12 in the battery test assembly.

The first end 11*a* of the positive electrode probe 11 and the first end 12*a* of the negative electrode probe 12 are fixed to the positive electrode 21 and the negative electrode 22 of the battery 20, respectively. The second end 11*b* of the positive electrode probe 11 and the second end 12*b* of the negative electrode probe 12 are configured to be electrically connected to the tester 13, in such a manner that the tester 13 tests the voltage between the positive electrode 21 and the negative electrode 22 of the battery 20 through the voltage between the second end 11*b* of the positive electrode probe 11 and the second end 12*b* of the negative electrode probe 12.

The positive electrode 21 and the negative electrode 22 of the battery 20 may each include the pole of the battery 20. The first end 11*a* of the positive electrode probe 11 and the first end 12*a* of the negative electrode probe 12 are fixed to the pole of the positive electrode 21 and the pole of the negative electrode 22 of the battery 20, respectively, by means of pressing, to fix the first end 11*a* of the positive electrode probe 11 and the first end 12*a* of the negative electrode probe 12 to the positive electrode 21 and the negative electrode 22 of the battery 20, respectively.

Figure 7:
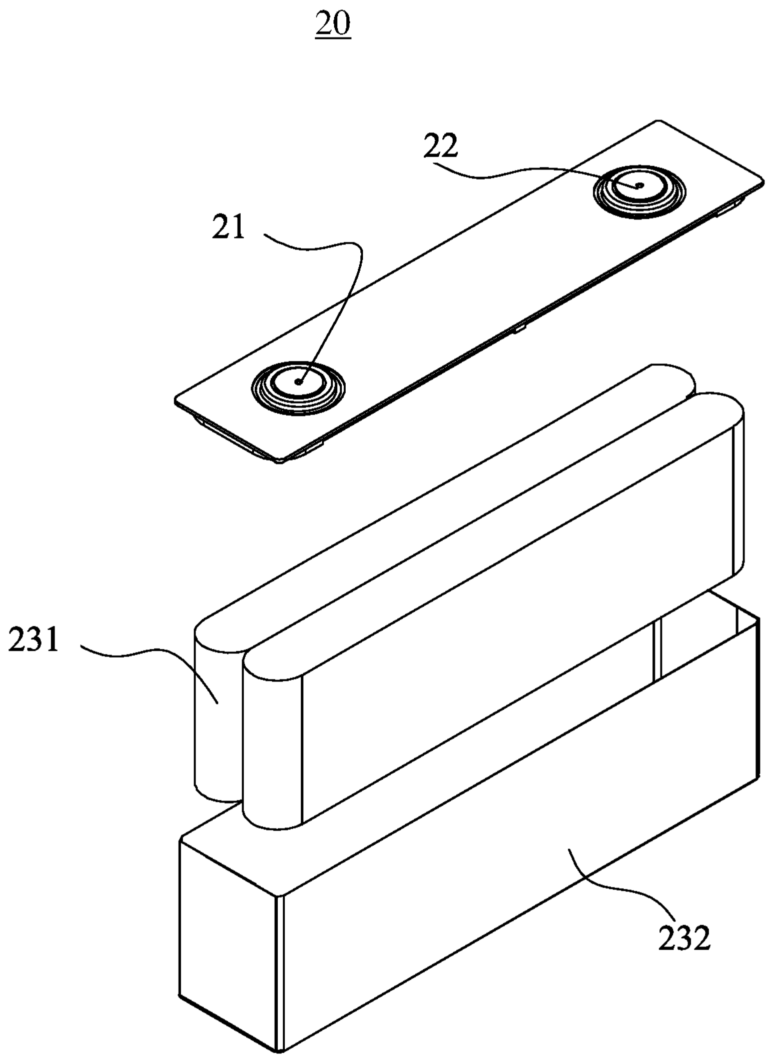
FIG. 7 is a schematic diagram of a structure of a battery in a battery assembly according to some embodiments of the present disclosure.

The main body portion 23 is a member in the battery 20 in which an electrochemical reaction occurs. Referring to FIG. 7, the main body portion 23 may include one or more electrode assemblies 231 and a housing 232. The housing 232 accommodates the one or more electrode assemblies 231. The electrode assembly 231 is formed primarily by winding or stacking a positive electrode sheet (not illustrated in the figures) and a negative electrode sheet (not illustrated in the figures). Typically, a separator (not illustrated in the figures) is disposed between the positive electrode sheet and the negative electrode sheet. Parts of the positive electrode sheet and the negative electrode sheet that contain active substances form a main body of the electrode assembly 231. Parts of the positive electrode sheet and the negative electrode sheet that contain no active substances each form a tab (not illustrated in the figures). A positive tab and a negative tab may be both located at one end of the main body, or may be located at two ends of the main body, respectively. During the charging and the discharging of the battery 20, positive active substances and negative active substances react with the electrolyte. The tab is connected to an electrode terminal to form a current circuit. The electrode terminal connected to the positive tab forms the positive electrode 21 of the battery 20, while the electrode terminal connected to the negative tab forms the negative electrode 22.

In some embodiments, the electrode assembly 231 of the battery is manufactured using a time-limited constant-volume and formation process, to avoid a failure of the electrode assembly 231 due to a difference between the voltage between the positive electrode 21 and the negative electrode 22 of the to-be-charged battery tested by the battery test assembly 10 and a voltage of the electrode assembly 231 of the to-be-charged battery.

Since the battery test assembly 10 included in the battery assembly 30 avoids the problem of the safe use of the battery 20 being affected due to the unstable test process of the battery, the battery 20 is safer in use.

Figure 8:
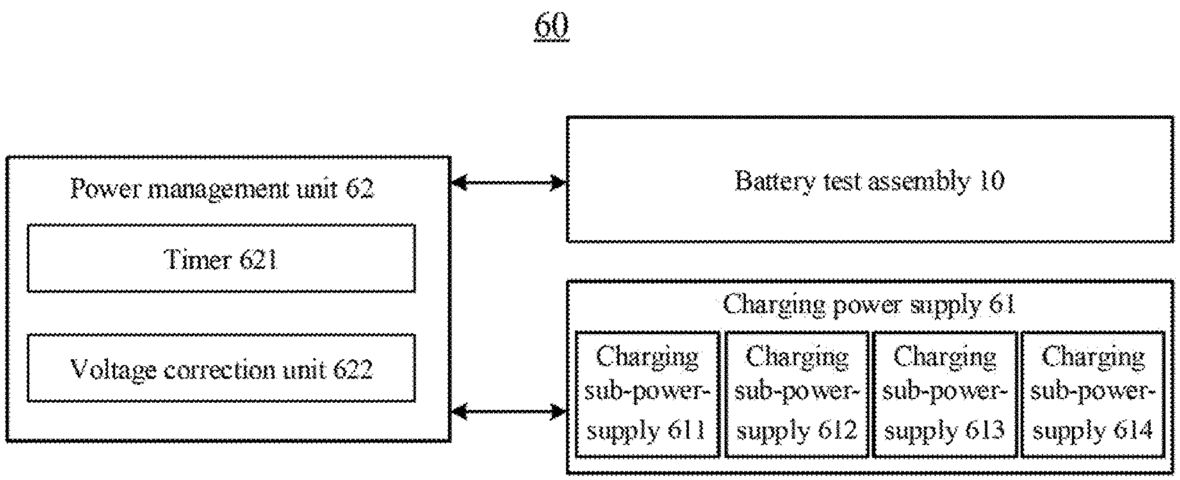
FIG. 8 is a block diagram of a structure of a charging assembly according to some embodiments of the present disclosure.

According to some embodiments of the present disclosure, a charging assembly is further provided. In some embodiments, as illustrated in FIG. 8, a charging assembly 60 includes the battery test assembly 10 according to any of the above-mentioned embodiments, a charging power supply 61, and a power management unit 62. The battery test assembly 10 is configured to test a voltage between the positive electrode 21 of the to-be-charged battery 20 and the negative electrode 22 of the to-be-charged battery 20 through the voltage between the second end 11*b* of the positive electrode probe 11 and the second end 12*b* of the negative electrode probe 12 tested by the tester 13. The charging power supply 61 is configured to charge the to-be-charged battery 20. The power management unit 62 is communicatively connected with the charging power supply 61 and the tester 13, and is configured to control, based on the voltage tested by the battery test assembly 10, the charging power supply 61 to charge the to-be-charged battery.

In some embodiments, the to-be-charged battery 20 may be a lithium iron phosphate battery, a lithium cobalt acid battery, a lithium nickel cobalt manganese acid battery, or the like. The present disclosure is not limited to any of these examples. In some embodiments, the charging power supply 61 may be a circuit that provides a constant current, e.g., including a rectifier circuit, a frequency conversion circuit, a voltage conversion circuit, or the like. The charging power supply 61 is configured to charge the to-be-charged battery 20 by outputting the constant current. In other embodiments, the charging power supply 61 may be a circuit that provides a constant voltage.

In some embodiments, the power management unit 62 may be a processor including firmware and software, to provide control and management functions. In some embodiments, the firmware includes an input/output device, a memory device, a processor device, and the like.

In some embodiments, data is transmitted between the power management unit 62 and the charging power supply 61 and the battery test assembly 10 via optical fibers. In some embodiments, data is transmitted between the power management unit 62 and the charging power supply 61 and the battery test assembly 10 via a wireless communication module. For example, the wireless communication module may be a Bluetooth communication module.

The power management unit 62 is communicatively connected with the tester 13 of the battery test assembly 10, in such a manner that the voltage tested by the tester 13 of the battery test assembly 10 is communicatively transmitted to the power management unit 62. In addition, the power management unit 62 is configured to obtain a control signal based on the voltage tested by the battery test assembly 10. The power management unit 61 is further communicatively connected with the charging power supply 61, in such a manner that the control signal of the power management unit 62 is communicatively transmitted to the charging power supply 61, for controlling the charging power supply 61.

In some embodiments, the power management unit 62 is provided with a comparator. The comparator is configured to compare the voltage tested by the battery test assembly 10 with a determined cut-off voltage to obtain control information. In some embodiments, the power management unit 62 is configured to input the control signal and communicatively transmit the control signal to the charging power supply 61, when the voltage tested by the battery test assembly 10 reaches the cut-off voltage, to cause the charging power supply 61 to stop charging.

The voltage between the positive electrode 21 of the to-be-charged battery 20 and the negative electrode 22 of the to-be-charged battery 20 is tested by the battery test assembly 10 in the charging assembly 60 by testing the voltage between the second end 11*b* of the positive electrode probe 11 and the second end 12*b* of the negative electrode probe 12, which avoids a problem of inaccuracy or instability of the tested voltage between the positive electrode 21 of the to-be-charged battery 20 and the negative electrode 22 of the to-be-charged battery 20 due to the contamination of the electrolyte or the crystallization of the electrolyte vapors. Therefore, safety of the to-be-charged battery charged by the charging assembly 60 is improved. In addition, during the charging, the power management unit 62 controls, based on the voltage tested by the battery test assembly 10, the charging power supply 61 to charge the to-be-charged battery 20, and controls, in response to the tested voltage reaching the cut-off voltage, the charging power supply 61 to stop charging the to-be-charged battery 20. The battery test assembly 10 is configured to test the voltage between the second end 11*b* of the positive electrode probe 11 and the second end 12*b* of the negative electrode probe 12 as the tested voltage between the positive electrode 21 of the to-be-charged battery 20 and the negative electrode 22 of the to-be-charged battery 20. Since the tested voltage is greater than an actual voltage of the electrode assembly of the to-be-charged battery 20, overcharging of the to-be-charged battery 20 by the charging power supply 61 is effectively avoided.

According to some embodiments of the present disclosure, further referring to FIG. 8, the power management unit 62 includes a timer 621. The timer 621 is electrically connected to the charging power supply 61 and is configured to collect a charging time length for the charging power supply 61 to charge the to-be-charged battery 20. The power management unit 62 is further configured to control, based on the charging time length collected by the timer 621, the charging power supply 61 to charge the to-be-charged battery 20.

The timer 621 is firmware provided in the power management unit 62 and may be an accumulator timer, a general-purpose timer, or the like. The present disclosure is not limited to any of these examples. The timer 621 is electrically connected to the charging power supply 61, and is configured to start timing when the charging power supply 61 outputs a current.

A charging time length for the charging power supply 61 to charge the to-be-charged battery 20 is controlled by the power management unit 62 based on a time length collected by the timer 621. The charging power supply 61 is controlled, by the power management unit 62 in response to the time length recorded by the timer 621 reaching a cut-off time length, to stop charging the to-be-charged battery 20. In this way, the charging time length is kept consistent in a case of a consistent charging current magnitude to ensure consistency of a capacity of the to-be-charged battery 20 after charging, which avoids the overcharging of the to-be-charged battery 20 and improves consistency of the charging of the to-be-charged battery 20.

According to some embodiments of the present disclosure, further referring to FIG. 8, the battery management unit 62 further includes a voltage correction unit 622. The voltage correction unit 622 is configured to correct the voltage tested by the battery test assembly 10. The power management unit 62 is further configured to control the charging power supply 61 based on the voltage corrected by the voltage correction unit 622.

For example, the voltage correction unit 622 may be a processor including firmware and software, to provide a computation or data processing function. In some embodiments, the firmware includes a calculator, a comparator, or the like. In some embodiments, the voltage correction unit 622 is configured to correct, based on a historical test voltage of the to-be-charged battery stored by the power management unit 62, the voltage tested by the battery test assembly 10.

In some embodiments, the historical test voltage includes a resting test voltage $V_0$ before formation of the to-be-charged battery 20 and a first test voltage value $V_1$ under constant-current charging. The resting test voltage before the formation is the actual voltage of the electrode assembly 23. Since the voltage of the electrode assembly 23 of the to-be-charged battery 20 continues to rise during the charging, the test voltage is lower than the actual voltage of the electrode assembly 23, considering that a contact resistance exists between the positive electrode probe 11 of the battery test assembly 10 and the positive electrode 21 of the to-be-charged battery 20 and a contact resistance exists between the negative electrode probe 12 of the battery test assembly 10 and the negative electrode 22 of the to-be-charged battery 20. During the charging, since the contact resistance between the positive electrode probe 11 of the battery test assembly 10 and the positive electrode 21 of the to-be-charged battery 20 and the contact resistance between the negative electrode probe 12 of the battery test assembly 10 and the negative electrode 22 of the to-be-charged battery 20 remain unchanged, a voltage $V_2$ tested by the battery test assembly 10 is corrected to obtain the corrected voltage $V_{correction}=V_2+V_1-V_0$.

The voltage $V_2$ tested by the battery test assembly 10 is corrected by the voltage correction unit 622, in such a manner that the corrected voltage $V_{correction}$ takes into account the contact resistance between the positive electrode probe 11 of the battery test assembly 10 and the positive electrode 21 of the to-be-charged battery 20 and the contact resistance between the negative electrode probe 12 of the battery test assembly 10 and the negative electrode 22 of the to-be-charged battery 20. Therefore, the corrected voltage $V_{correction}$ can more accurately reflect the voltage between the second end 11*b* of the positive electrode probe 11 and the second end 12*b* of the negative electrode probe 12 of the battery test assembly 10. The charging power supply 61 is controlled by the power management unit based on the corrected voltage, which further ensures safety of the charging of the to-be-charged battery 20.

According to some embodiments of the present disclosure, in some embodiments, the charging power supply 61 includes a plurality of charging sub-power-supplies. For example, further referring to FIG. 7, the plurality of charging sub-power-supplies includes a charging sub-power-supply 611 to a charging sub-power-supply 614. A plurality of charging currents corresponding to respective ones of the plurality of charging sub-power-supplies is not all identical, such that the charging power supply 61 is configured to charge the to-be-charged battery 20 using one of the plurality of charging currents. According to the embodiments of the present disclosure, the voltage correction unit 622 is configured to correct, based on the charging current used by the charging power supply 61, the voltage tested by the battery test assembly 10.

In some embodiments, the charging power supply 61 is configured to provide a plurality of charging sub-power-supplies through a plurality of voltage conversion circuits. Each charging sub-power-supply provides one charging current, such that the charging power supply 61 is configured to charge the to-be-charged battery 20 by using the charging current provided by the charging sub-power-supply. In some embodiments, the charging power supply 61 is configured to communicatively transmit a value of the used charging current to the power management unit 62. The voltage correction unit 622 in the power management unit 62 is configured to correct, based on the charging current used by the charging power supply 61, the voltage tested by the battery test assembly 10.

In some embodiments, for charging under different rates, since the contact resistance between the positive electrode probe 11 of the battery test assembly 10 and the positive electrode 21 of the to-be-charged battery 20 and the contact resistance between the negative electrode probe 12 of the battery test assembly 10 and the negative electrode 22 of the to-be-charged battery 20 remain unchanged, and the voltage of the contact resistance is proportional to a charging current magnitude, a correction may be performed based on a historical test voltage and a historical test current during historical charging of the to-be-charged battery 20 that are stored by the power management unit 62.

In some embodiments, the historical test voltage includes the resting test voltage $V_0$ before the formation of the to-be-charged battery 20 and the first test voltage value $V_1$ under constant-current charging, and the historical test current includes a first test current value $I_1$ under constant-current charging. Accordingly, the voltage $V_2$ tested by the battery test assembly 10 is corrected to obtain the corrected voltages of charging and discharging under different rates as follows: $V_{correction}=V_2+(V_1-V_0)*I_2/I_1$, where $I_2$ is a current charging current.

The voltage tested by the battery test assembly 10 is corrected by the voltage correction unit 622 based on the charging current used by the charging power supply 61, which ensures the safety of the charging of the to-be-charged battery 20 under different charging rates.

Figure 9:
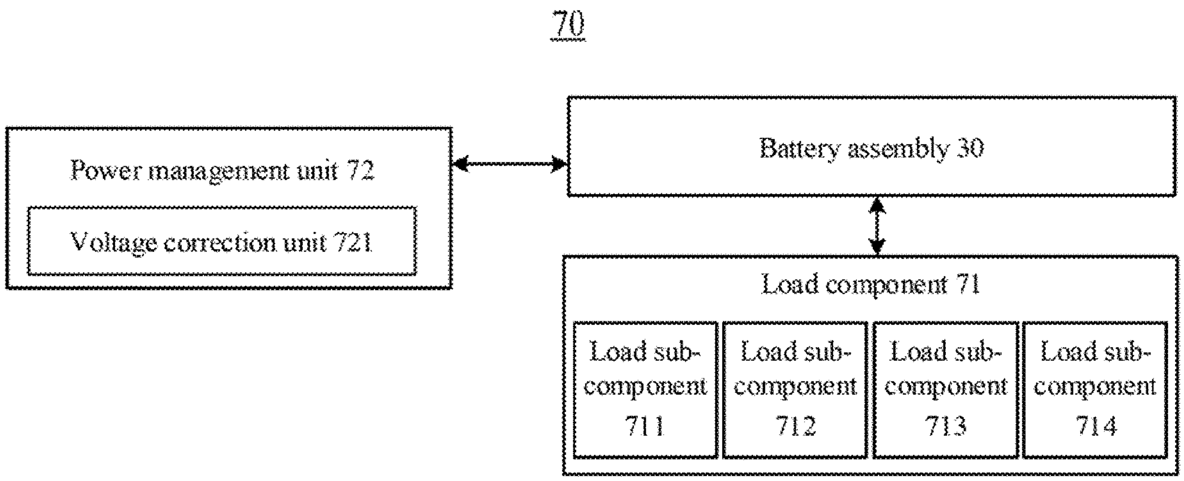
FIG. 9 is a block diagram of a structure of an electric device according to some embodiments of the present disclosure.

According to some embodiments of the present disclosure, an electric device is further provided. In some embodiments, as illustrated in FIG. 9, the electric device 70 includes the battery assembly 30 and a load component 71. The battery assembly 30 includes the battery test assembly 10 according to any of the above-mentioned embodiments and the battery 20. The load component 71 is connected to the positive electrode of the battery 20 in the battery assembly 30 and the negative electrode of the battery 20 in the battery assembly 30 to discharge the battery 20.

The electric device 70 may be any device that requires power from a battery for operation. For example, the electric device may be a cell phone, a tablet computer, an electric vehicle, or the like.

In some embodiments, the load component 71 may be a component in the electric device 70 and powered by the battery 20 to provide one or more functions. For example, in the electric vehicle, the load component 71 includes a motor, a controller, and the like. In the cell phone, the load component includes a processor, a display screen, and the like.

The load component 71 is connected to the positive electrode 21 and the negative electrode 22 of the battery 20, in such a manner that the battery 20 supplies power to the load component 71. The battery 20 is discharged through the electrode assembly 231, in such a manner that the battery 20 outputs a current through the positive electrode 21 and the negative electrode 22.

Since the battery test assembly 10 included in the battery assembly 30 in the electric device 70 avoids the problem of the safe use of the battery 20 being affected due to the unstable test process of the battery, the battery 20 is safer in use. Therefore, the electric device 70 is safer in use.

According to some embodiments of the present disclosure, referring to FIG. 9, the electric device 70 further includes a power management unit 72 configured to control, based on the voltage tested by the tester 13 in the battery assembly 30, the battery 20 to supply power to the load component 71, and disconnect the load component 71 from the positive electrode 21 and the negative electrode 22 of the battery 20 in response to the voltage tested by the tester 13 reaching a cut-off voltage.

In some embodiments, the power management unit 72 may be a processor including firmware and software, to provide control and management functions. In some embodiments, the firmware includes an input/output device, a memory device, a processor device, and the like.

In some embodiments, data is transmitted between the power management unit 72 and the battery assembly 30 and the load component 71 via optical fibers. In some embodiments, data is transmitted between the power management unit 72 and the battery assembly 30 and the load component 71 via a wireless communication module. For example, the wireless communication module may be a Bluetooth communication module.

The power management unit 72 is communicatively connected with the tester 13 of the battery test assembly 10 in the battery assembly 30, in such a manner that the voltage tested by the tester 13 of the battery test assembly 10 is communicatively transmitted to the power management unit 72. In addition, the power management unit 72 is configured to obtain a control signal based on the voltage tested by the battery test assembly 10. The power management unit 72 is further communicatively connected with the battery 20, in such a manner that the control signal of the power management unit 72 is communicatively transmitted to the battery 20, for controlling a process in which the battery 20 supplies power to the load component 71.

In some embodiments, the power management unit 72 is provided with a comparator. The comparator is configured to compare the voltage tested by the battery test assembly 10 in the battery assembly 30 with a determined cut-off voltage to obtain control information. In some embodiments, the power management unit 72 is configured to input the control signal and communicatively transmit the control signal to the battery 20, when the voltage tested by the battery test assembly 10 reaches the cut-off voltage, to cause the battery 20 to stop discharging.

During use of the electric device 70, the battery 20 in the battery assembly 30 is discharged, and the power management unit 72 controls, based on the voltage tested by the tester 13 of the battery assembly 30, the battery 20 to supply power to the load component 71, and disconnects the load component 71 from the positive electrode 21 and the negative electrode 22 of the battery 20 in response to the tested voltage reaching the cut-off voltage. The tester 13 is configured to test the voltage between the second end 11*b* of the positive electrode probe 11 and the second end 12*b* of the negative electrode probe 12 as the tested voltage between the positive electrode 21 and the negative electrode 22 of the battery 20. Since the voltage between the second end 11*b* of the positive electrode probe 11 and the second end 12*b* of the negative electrode probe 12 is smaller than the voltage between the positive electrode 21 and the negative electrode 22 of the battery 20, overdischarging of the battery 20 is effectively avoided.

According to some embodiments of the present disclosure, further referring to FIG. 9, the battery management unit 72 further includes a voltage correction unit 721. The voltage correction unit 721 is configured to correct the voltage tested by the tester 13 in the battery assembly 30. The power management unit 72 is further configured to control the battery 20 based on the voltage corrected by the voltage correction unit 721.

For example, the voltage correction unit 721 may be a processor including firmware and software, to provide a computation or data processing function. In some embodiments, the firmware includes a calculator, a comparator, or the like. In some embodiments, the voltage correction unit is configured to correct, based on a historical test voltage of the battery 20 stored by the power management unit 72, the voltage tested by the battery test assembly 10.

In some embodiments, the historical test voltage includes a resting test voltage $V_3$ before the discharging of the battery 20 and a first discharging test voltage $V_4$. The resting test voltage before the formation is the actual voltage of the electrode assembly 231. Since the voltage of the electrode assembly 231 of the battery 20 continues to decrease during the discharging, the voltage tested by the battery test assembly 10 is higher than the actual voltage of the electrode assembly 231, considering that a contact resistance exists between the positive electrode probe 11 of the battery assembly 30 and the positive electrode 21 of the battery 20 and a contact resistance exists between the negative electrode probe 12 of the battery assembly 30 and the negative electrode 22 of the battery 20. During the discharging, since the contact resistance between the positive electrode probe 11 of the battery test assembly 10 of the battery assembly 30 and the positive electrode 21 of the battery 20 and the contact resistance between the negative electrode probe 12 of the battery test assembly 10 of the battery assembly 30 and the negative electrode 22 of the battery 20 remain unchanged, a voltage $V_5$ tested by the battery test assembly 10 is corrected to obtain the corrected voltage $V_{correction}=V_5-V_4+V_3$.

The voltage tested by the tester 13 of the battery test assembly 10 is corrected by the voltage correction unit 721, in such a manner that the corrected voltage takes into account the contact resistance between the positive electrode 21 of the battery 20 and the positive electrode probe 11 of the battery test assembly 10 and the contact resistance between the negative electrode 22 of the battery 20 and the negative electrode probe 12 of the battery test assembly 10. Therefore, the corrected voltage can more accurately reflect the voltage between the second end 11*a* of the positive electrode probe 11 and the second end 12*b* of the negative electrode probe 12 of the battery test assembly 10. The electrode assembly 231 is controlled by the power management unit 72 based on the corrected voltage, which further ensures safety of the discharging of the battery 20.

According to some embodiments of the present disclosure, the load component 71 includes a plurality of load sub-components. In some embodiments, as illustrated in FIG. 9, the plurality of load sub-components includes a load sub-component 711 to a load sub-component 714. When each of the plurality of load sub-components is communicatively connected with the battery 20 to discharge the electrode assembly 231 of the battery 20, the electrode assembly 231 generates different discharge currents. In addition, when the electrode assembly 231 of the battery 20 is discharged by connecting a different quantity of load sub-components among the plurality of load sub-components with the battery 20, the electrode assembly 231 generates different discharge currents. Therefore, the electrode assembly 231 can be configured to generate a plurality of discharge currents corresponding to the plurality of load sub-components. The plurality of discharge currents is not all identical. The electrode assembly 231 is configured to output one of the plurality of discharge currents when discharged. The voltage correction unit 721 is configured to correct, based on the discharge current outputted by the electrode assembly 231, the voltage tested by the tester 13.

In some embodiments, the load component 71 provides a plurality of load sub-components through a plurality of load circuits or load devices. Each load sub-component has a corresponding resistance, such that the electrode assembly 231 of the battery 20 is discharged when battery 20 is connected with the load sub-component. In some embodiments, the battery 20 is configured to communicatively transmit a value of the discharge current output by the electrode assembly 231 to the power management unit 72, such that the voltage correction unit 721 in the power management unit 72 is configured to correct, based on the discharge current output by the electrode assembly 231 of the battery 20, the voltage tested by the battery test assembly 10.

In some embodiments, for discharging under different rates, since the contact resistance between the positive electrode probe 11 of the battery test assembly 10 and the positive electrode 21 of the to-be-charged battery 20 and the contact resistance between the negative electrode probe 12 of the battery test assembly 10 and the negative electrode 22 of the to-be-charged battery 20 remain unchanged, and the voltage of the contact resistance is proportional to the charging current magnitude, a correction may be performed based on a historical test voltage and a historical test current during historical discharging of the battery 20 that are stored by the power management unit 72.

In some embodiments, the historical test voltage includes the resting test voltage $V_3$ before the formation of the battery 20 and the first discharging test voltage $V_4$, and the historical test current includes a first discharging test current value $I_3$. Accordingly, the voltage $V_2$ tested by the battery test assembly is corrected to obtain the corrected voltages of charging and discharging under different rates as follows: $V_{correction}=V_5-(V_4-V_3)*I_4/I_3$, where $I_4$ is a charging current under a current charging rate.

The voltage tested by the tester 13 is corrected by the voltage correction unit based on the discharge current output when the electrode assembly 231 of the battery 20 is discharged, which ensures the safety of the discharging of the battery 20 under different discharging rates.

According to some embodiments of the present disclosure, referring to FIG. 3, the battery assembly is provided by the present disclosure. As illustrated in FIG. 3, the battery assembly 30 includes the battery 20 and the test assembly 10. The battery 20 includes the main body portion 23 and the positive electrode 21 and the negative electrode 22 that are electrically connected to the main body portion 23. The positive electrode 21 and the negative electrode 22 are electrically connected to the positive electrode probe 11 and the negative electrode probe 12, respectively. Specifically, the first end 11*a* of the positive electrode probe 11 and the first end 12*a* of the negative electrode probe 12 are fixed to the positive electrode 21 and the negative electrode 22 of the battery 20, respectively. The second end 11*b* of the positive electrode probe 11 and the second end 12*b* of the negative electrode probe 12 are configured to be electrically connected to the tester 13, in such a manner that the tester 13 tests the voltage between the positive electrode 21 and the negative electrode 22 of the battery 20 through the voltage between the second end 11*b* of the positive electrode probe 11 and the second end 12*b* of the negative electrode probe 12. The positive electrode 21 and the negative electrode 22 of the tested battery 20 may each include the pole of the battery 20. The first end 11*a* of the positive electrode probe 11 and the first end 12*a* of the negative electrode probe 12 are fixed to the pole of the positive electrode 21 and the pole of the negative electrode 22 of the battery 20, respectively, by means of pressing, to fix the first end 11*a* of the positive electrode probe 11 and the first end 12*a* of the negative electrode probe 12 to the positive electrode 21 and the negative electrode 22 of the battery 20, respectively.

Finally, it should be noted that each of the above embodiments is used only to illustrate, rather than to limit, the technical solutions of the present disclosure. Although the present disclosure has been described in detail with reference to the foregoing embodiments, it is conceivable for those skilled in the art that modifications can be made to the technical solutions described in the foregoing embodiments, or equivalent replacements can be made to some or all of the technical features in the technical solutions described in the foregoing embodiments. These modifications or equivalent replacements, which do not cause the essence of corresponding technical solutions to depart from the scope of the technical solutions of the embodiments of the present disclosure, shall fall within the scope of the claims and the specification of the present disclosure. In particular, the technical features mentioned in each embodiment can be combined arbitrarily without any structural conflict. The present disclosure is not limited to the particular embodiments disclosed herein, and includes all technical solutions falling within the scope of the claims.

What is claimed is:

1. A charging assembly, comprising:

a battery test assembly comprising:

a positive electrode probe having a first end configured to be electrically connected to a positive electrode of a to-be-charged battery;

a negative electrode probe having a first end configured to be electrically connected to a negative electrode of the to-be-charged battery; and a tester electrically connected to each of a second end of the positive electrode probe and a second end of the negative electrode probe, the tester being configured to test a voltage between the positive electrode of the to-be-charged battery and the negative electrode of the to-be-charged battery by testing a voltage between the second end of the positive electrode probe and the second end of the negative electrode probe;

a charging power supply configured to charge the to-be-charged battery; and a power management unit communicatively connected with the charging power supply and the tester, the power management unit being configured to control, based on the voltage tested by the battery test assembly, the charging power supply to charge the to-be-charged battery;

wherein:

the power management unit comprises a timer electrically connected to the charging power supply, the timer being configured to collect a charging time length for the charging power supply to charge the to-be-charged battery; and the power management unit is further configured to control, based on the charging time length collected by the timer, the charging power supply to charge the to-be-charged battery.

2. The charging assembly according to claim 1, wherein the first end of the positive electrode probe has a size greater than a size of the second end of the positive electrode probe, and the first end of the negative electrode probe has a size greater than a size of the second end of the negative electrode probe.

3. The charging assembly according to claim 1, wherein at least one of the positive electrode probe and the negative electrode probe has a cylindrical protrusion structure.

4. The charging assembly according to claim 1, wherein each of the second end of the positive electrode probe and the second end of the negative electrode probe comprises a first connection portion and a second connection portion, the first connection portion being configured to be electrically connected to an external circuit, and the second connection portion being configured to be electrically connected to the tester.

5. The charging assembly according to claim 1, wherein the first end of the positive electrode probe has a fixation structure configured to fixedly connect the first end of the positive electrode probe to the positive electrode, and the first end of the negative electrode probe has a fixation structure configured to fixedly connect the first end of the negative electrode probe to the negative electrode.

6. The charging assembly according to claim 1, wherein:

the power management unit further comprises a voltage correction unit configured to correct the voltage tested by the battery test assembly; and the power management unit is further configured to control the charging power supply based on the voltage corrected by the voltage correction unit.

7. The charging assembly according to claim 6, wherein:

the charging power supply comprises a plurality of charging sub-power-supplies, a plurality of charging currents corresponding to respective ones of the plurality of charging sub-power-supplies are not all identical, such that the charging power supply is capable of charging the to-be-charged battery using one of the plurality of charging currents; and the voltage correction unit is configured to correct, based on the charging current used by the charging power supply, the voltage tested by the battery test assembly.

8. An electric device, comprising:

a battery assembly comprising:

a battery; and a battery test assembly comprising:

a positive electrode probe having a first end configured to be electrically connected to a positive electrode of a battery;

a negative electrode probe having a first end configured to be electrically connected to a negative electrode of the battery; and a tester electrically connected to each of a second end of the positive electrode probe and a second end of the negative electrode probe, the tester being configured to test a voltage between the positive electrode of the battery and the negative electrode of the battery by testing a voltage between the second end of the positive electrode probe and the second end of the negative electrode probe;

a load component connected to the positive electrode of the battery and the negative electrode of the battery to discharge the battery; and a power management unit comprising a voltage correction unit configured to correct the voltage tested by the battery test assembly, and configured to control the battery based on the voltage corrected by the voltage correction unit;

wherein:

the load component comprises a plurality of load sub-components, a plurality of discharge currents corresponding to respective ones of the plurality of load sub-components are not all identical, such that the battery is configured to output one of the plurality of discharge currents when discharged; and the voltage correction unit is configured to correct, based on the one of the plurality of discharge currents outputted by the battery, the voltage tested by the battery test assembly.

9. The electric device according to claim 8, wherein:

the power management unit is further configured to control, based on the voltage tested by the battery test assembly, the battery to supply power to the load component, and disconnect the load component from the positive electrode of the battery and the negative electrode of the battery in response to the voltage tested by the battery test assembly reaching a cut-off voltage.

10. A charging assembly, comprising:

a battery test assembly comprising:

a positive electrode probe having a first end configured to be electrically connected to a positive electrode of a to-be-charged battery;

a negative electrode probe having a first end configured to be electrically connected to a negative electrode of the to-be-charged battery; and a tester electrically connected to each of a second end of the positive electrode probe and a second end of the negative electrode probe, the tester being configured to test a voltage between the positive electrode of the to-be-charged battery and the negative electrode of the to-be-charged battery by testing a voltage between the second end of the positive electrode probe and the second end of the negative electrode probe;

a charging power supply configured to charge the to-be-charged battery; and a power management unit communicatively connected with the charging power supply and the tester, the power management unit being configured to control, based on the voltage tested by the battery test assembly, the charging power supply to charge the to-be-charged battery;

wherein:

the power management unit comprises a voltage correction unit configured to correct the voltage tested by the battery test assembly;

the power management unit is further configured to control the charging power supply based on the voltage corrected by the voltage correction unit;

the charging power supply comprises a plurality of charging sub-power-supplies, a plurality of charging currents corresponding to respective ones of the plurality of charging sub-power-supplies are not all identical, such that the charging power supply is capable of charging the to-be-charged battery using one of the plurality of charging currents; and the voltage correction unit is configured to correct, based on the charging current used by the charging power supply, the voltage tested by the battery test assembly.

* * * * *